(12) United States Patent
Haimerl et al.

(10) Patent No.: US 6,897,568 B2
(45) Date of Patent: May 24, 2005

(54) ELECTRONIC COMPONENT WITH FLEXIBLE CONTACTING PADS AND METHOD FOR PRODUCING THE ELECTRONIC COMPONENT

(75) Inventors: Alfred Haimerl, Sinzing (DE); Harry Hedler, Germering (DE); Jens Pohl, Bernhardswald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/260,872

(22) Filed: Sep. 30, 2002

(65) Prior Publication Data

US 2003/0067755 A1 Apr. 10, 2003

Related U.S. Application Data

(63) Continuation of application No. PCT/DE01/01194, filed on Mar. 29, 2001.

(30) Foreign Application Priority Data

Mar. 31, 2000 (DE) .......................................... 100 16 132

(51) Int. Cl.[7] .......................... H01L 23/48; H01L 23/52; H01L 29/40
(52) U.S. Cl. ..................................................... 257/779
(58) Field of Search ................................ 257/777–781, 257/735–739; 438/612, 613, 108, 117

(56) References Cited

U.S. PATENT DOCUMENTS

| | | | |
|---|---|---|---|
| 4,001,870 A | 1/1977 | Saiki et al. | |
| 4,074,342 A | 2/1978 | Honn et al. | |
| 4,365,264 A | 12/1982 | Mukai et al. | |
| 4,618,878 A | 10/1986 | Aoyama et al. | |
| 4,740,700 A | 4/1988 | Shaham et al. | |

(Continued)

FOREIGN PATENT DOCUMENTS

| | | |
|---|---|---|
| CA | 2 301 083 A1 | 12/1999 |
| DE | 196 39 934 A1 | 4/1998 |
| EP | 0 930 641 A2 | 7/1999 |
| JP | 61-242 041 | 10/1986 |
| JP | 01-192125 A | 8/1989 |
| JP | 01 281 792 A | 11/1989 |
| JP | 3-231 437 | 10/1991 |
| JP | 04 280 458 | 10/1992 |
| JP | 5-182 972 | 7/1993 |
| JP | 05-243231 A | 9/1993 |
| JP | 5-251 455 | 9/1993 |
| JP | 11-168122 A | 6/1999 |
| JP | 11-251378 A | 9/1999 |
| WO | 98/50950 | 11/1998 |
| WO | WO 98/52225 | 11/1998 |
| WO | WO 98/55669 | 12/1998 |
| WO | 99/05895 | 2/1999 |
| WO | 00/79589 A1 | 12/2000 |

OTHER PUBLICATIONS

Beine, H.: "Polymer–Flip–Chip–Technologie" [Polymer–FlipChip–Technology], productronic, Jul. 1996, pp. 26–27.

Burggraaf, P.: "Chip Scale and Flip Chip: Attractive Solutions", Solid State Technology, Jul. 1998, pp. 239–240, 242, 244, 246.

Anonymous: "Method of Testing Chips and Joining Chips to Substrates", *Chemical Abstracts* XP–000169195, p. 130.

*Primary Examiner*—David A. Zarneke
(74) *Attorney, Agent, or Firm*—Laurence A. Greenberg; Werner H. Stemer; Gregory L. Mayback

(57) ABSTRACT

An electronic component has an electronic circuit and a rubber-elastic elevation. The rubber-elastic elevation is formed of an insulating rubber-elastic material disposed on a surface of the electronic component and has a conductive land on its crest. The rubber-elastic elevation also has on its sloping side or in its volume a conduction path between the land and the electronic circuit.

19 Claims, 9 Drawing Sheets

U.S. PATENT DOCUMENTS

| | | |
|---|---|---|
| 4,813,129 A | 3/1989 | Karnezos |
| 4,885,126 A | 12/1989 | Polonio |
| 4,902,606 A | 2/1990 | Patraw |
| 5,072,520 A | 12/1991 | Nelson |
| 5,148,265 A | 9/1992 | Khandros et al. |
| 5,148,266 A | 9/1992 | Khandros et al. |
| 5,180,311 A | 1/1993 | Schreiber et al. |
| 5,196,371 A | 3/1993 | Kulesza et al. |
| 5,420,329 A | 5/1995 | Zeiss |
| 5,455,390 A | 10/1995 | DiStefano et al. |
| 5,489,749 A | 2/1996 | DiStefano et al. |
| 5,491,302 A | 2/1996 | Distefano et al. |
| 5,508,228 A | 4/1996 | Nolan et al. |
| 5,604,380 A | 2/1997 | Nishimura et al. |
| 5,619,017 A | 4/1997 | Distefano et al. |
| 5,666,270 A | 9/1997 | Matsuda et al. |
| 5,679,977 A | 10/1997 | Khandros et al. |
| 5,749,997 A | 5/1998 | Tang et al. |
| 5,777,379 A | 7/1998 | Karavakis et al. |
| 5,874,782 A | 2/1999 | Palagonia |
| 5,907,785 A | 5/1999 | Palagonia |
| 6,211,572 B1 * | 4/2001 | Fjelstad et al. ............. 257/781 |
| 6,277,669 B1 * | 8/2001 | Kung et al. ................. 438/106 |
| 6,284,563 B1 | 9/2001 | Fjelstad |
| 6,319,564 B1 | 11/2001 | Naundorf et al. |
| 6,396,145 B1 * | 5/2002 | Nagai et al. ................ 257/737 |
| 6,433,427 B1 * | 8/2002 | Wu et al. .................... 257/737 |
| 6,492,200 B1 | 12/2002 | Park et al. |

* cited by examiner

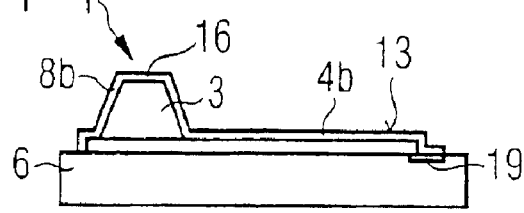
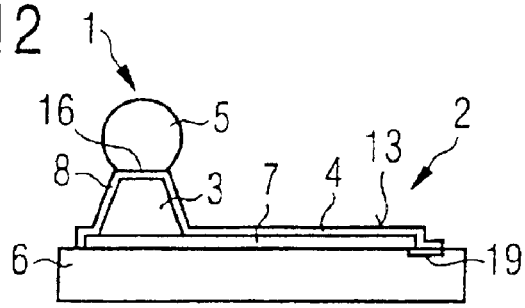
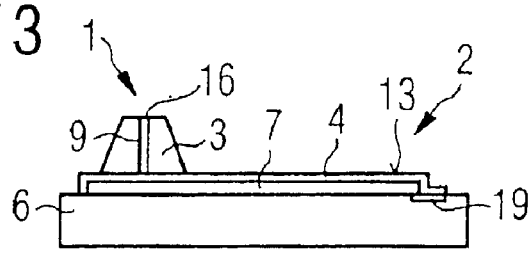
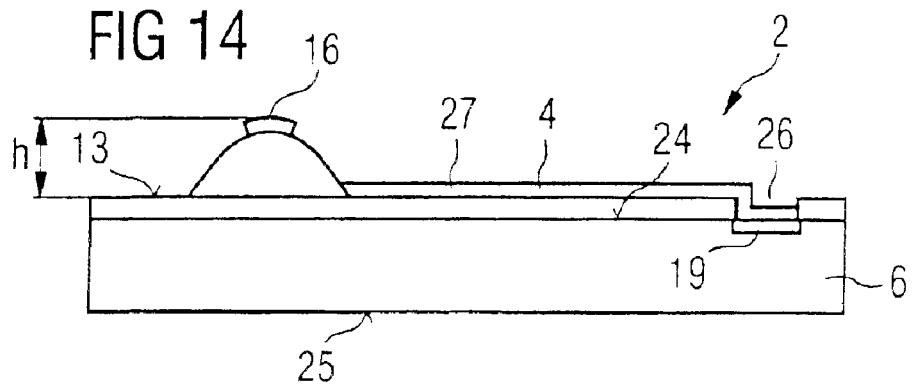

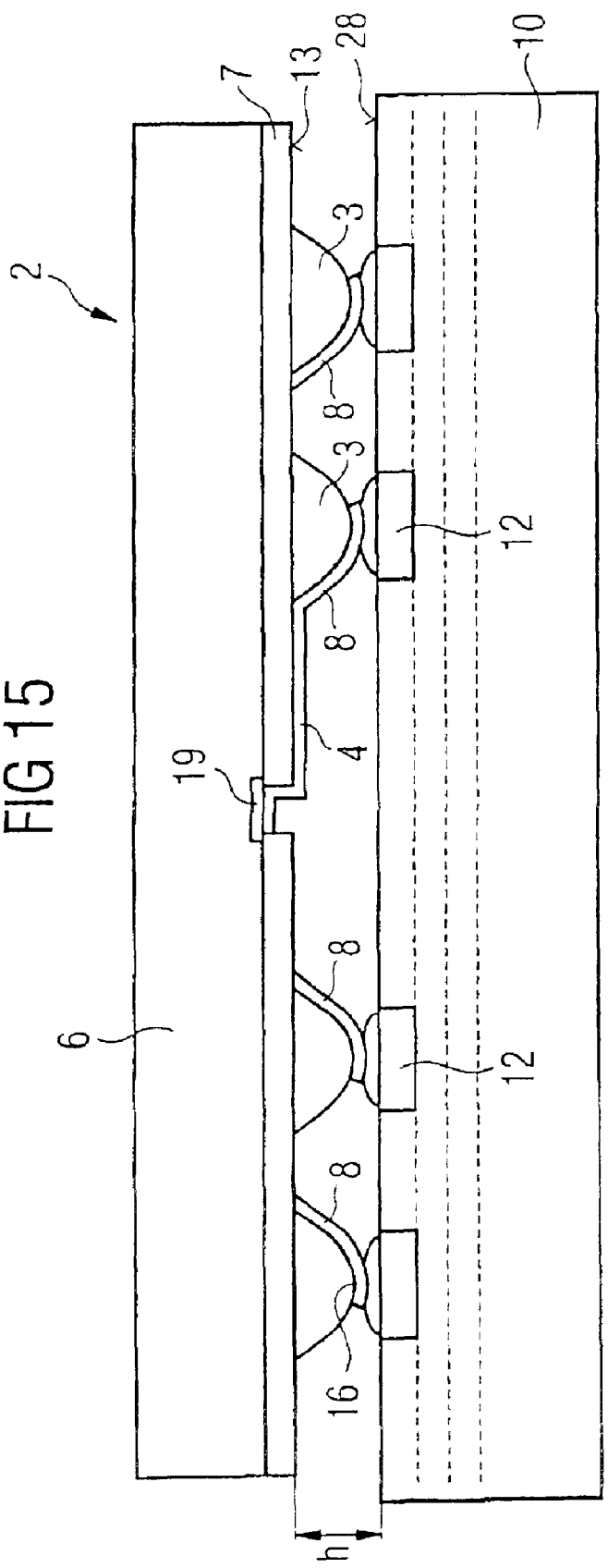

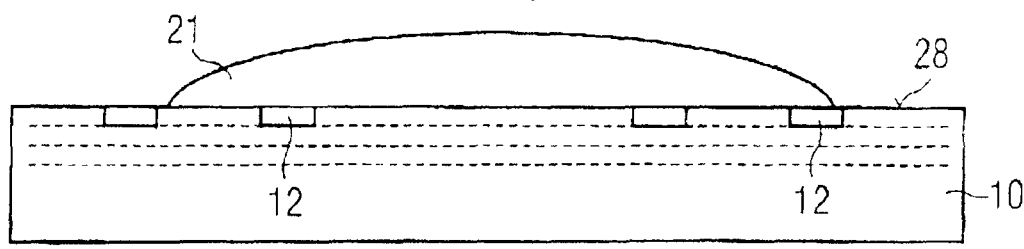
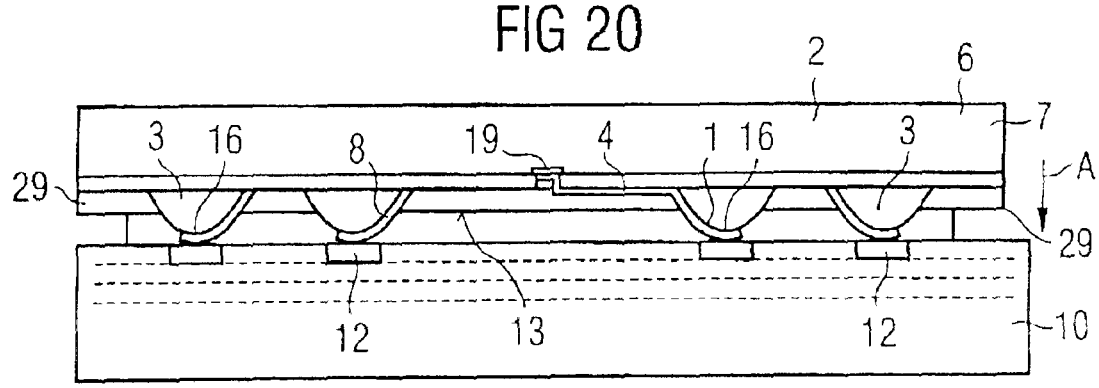
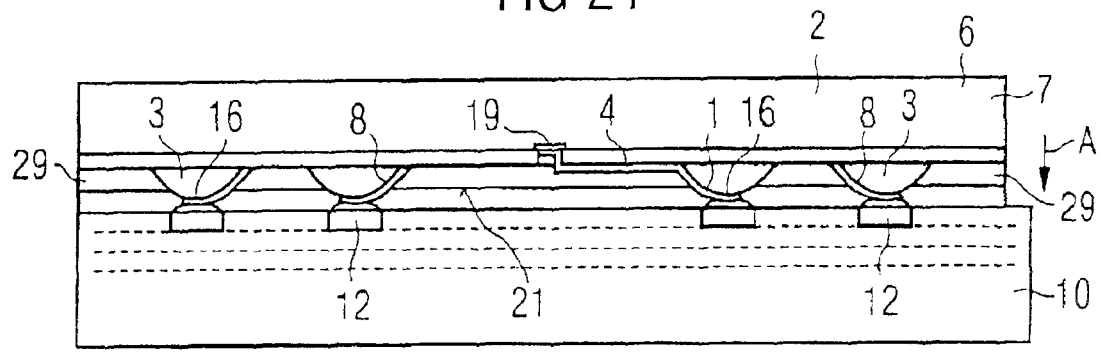

ELECTRONIC COMPONENT WITH FLEXIBLE CONTACTING PADS AND METHOD FOR PRODUCING THE ELECTRONIC COMPONENT

CROSS-REFERENCE TO RELATED APPLICATIONS

This application is a continuation of copending International Application No. PCT/DE01/01194, filed Mar. 29, 2001, which designated the United States and was not published in English.

BACKGROUND OF THE INVENTION

Field of the Invention

The present invention relates to an electronic component with an electronic circuit. The invention also relates to a method for producing the electronic component according to the invention.

A component of the generic type is disclosed in Japanese Patent JP 5-251455. A problem of the solution known from the publication is the relative rigidity of an angular elevation formed by a photolithographic process from a polyimide film, protruding out of the surface of the component and enveloped in a layer of metal. On account of the polyimide film and on account of the complete encapsulation in a relatively rigid metal coating, the elevation is not suitable as a compensating device between the contacts of the component and the terminals of a component carrier to which the component is to be electrically connected via the external contacts. A component with an external contact structure of this type often has the soldered connections between the component and the carrier damaged or destroyed when it is applied to a printed circuit board. Furthermore, it is known from U.S. Pat. No. 5,685,885 to dispose electrical contacts on a rubber-elastic layer. The production of components with the layer disclosed there is a complex undertaking.

SUMMARY OF THE INVENTION

It is accordingly an object of the invention to provide an electronic component with flexible contacting pads and a method for producing the electronic component which overcomes the above-mentioned disadvantages of the prior art devices and methods of this general type, which has durable soldered connections and provides height compensation when there are unevennesses between an electronic component and a carrier such as a printed circuit board.

With the foregoing and other objects in view there is provided, in accordance with the invention, an electronic component. The electronic component contains a chip having a surface and an electronic circuit, conductor tracks disposed on the surface, and metal-coated elevations formed of an insulating material disposed on the surface. The metal-coated elevations are formed of a rubber-elastic material and have crests, sloping sides, and metal lands with each of the metal-coated elevations having a metal land, a crest and a sloping side. Conduction paths are provided and one of the conduction paths is disposed on each of the sloping sides and connected between the land and one of the conductor tracks. The metal lands are electrically connected to the electronic circuit through the conduction paths and the conductor tracks.

It is provided according to the invention that the electronic component has an electronic circuit and conductor tracks on a surface for electrically connecting the electronic circuit to metal-coated elevations formed partially from an insulating material. The elevations contain a rubber-elastic material and respectively having on their crest a metal land and on their sloping side or in their volume a conduction path, which is disposed between the land and one of the conductor tracks on the surface of the electronic component.

In this context, a conduction path is understood as meaning any electrically conducting path on the sloping side of the rubber-elastic elevation and/or within the volume of the rubber-elastic elevation, while conductor tracks represent electrically conducting paths on the surface of the electronic component or on a semiconductor chip of the electronic component.

An idea on which the invention is based is that mechanical stresses, for example under thermal loading of the component, are reduced, that is in particular at the soldered connections. This may take place by compensating for different expansions and unevennesses.

The configuration according to the invention has particular significance in the case of electronic components of a size which corresponds largely to the size of the electronic circuit or the circuit chip of the component, that is in the case of chip-size components. Since, apart from the electronic circuit on a circuit chip, virtually no further package elements are provided here, the stresses can be absorbed at the electronic component. Consequently, with such components there is the risk of the electrical contacts being damaged or destroyed. Specifically in such a case, the occurrence of excessive mechanical stresses can be avoided, and consequently the operational reliability of the component can be guaranteed, by a rubber-elastic elevation of the kind proposed according to the invention. At the same time, the rubber-elastic elevation compensates in an advantageous way for unevennesses between the components to be contacted.

The conductive lands of the electronic component are disposed on a rubber-elastic elevation that compensates for the mechanical stresses occurring. To establish a conducting connection with respect to the conductive land on the crest of an elevation, a conduction path may be provided on the sloping side or in the volume of the rubber-elastic elevation between the conductive land and the electronic circuit or the conductor tracks. The electronic circuit may directly adjoin the rubber-elastic elevation with its conductor tracks and is electrically connected to the conduction paths of the elevation.

In one embodiment of the invention, the elevation has a dome-shaped contour with a smooth gently curved transition to the surface of the electronic component. The contour has the advantage that both the crest on which the land rests and the conduction line leading out from the crest via the conduction path to the surface are formed without sharp transitions, which are susceptible to cracking, so that a gradual rise from the surface of the electronic component to the crest of the rubber-elastic elevation becomes possible for the metal and consequently a rubber-elastically supported land with a reliable conduction path to the electronic circuit is provided.

In a further embodiment of the invention, it is envisaged to increase the rubber-elastic property of the elevations further by a flat base area of rubber-elastic material initially being disposed on the surface of the electronic component and then the rubber-elastic elevations being formed on the rubber-elastic flat base area. From the respective crests of the rubber-elastic elevations, which are provided with lands, conduction paths can be led initially on the sloping sides of the respective rubber-elastic elevation and then over the rubber-elastic flat base to the conductor tracks on the surface. Consequently, this embodiment of the invention achieves a high degree of compliance of the lands on the crests of the elevations, because the compliances of the elevations and the rubber-elastic base complement each other.

A further embodiment of the invention provides that the rubber-elastic elevation has a base area with a diameter of between 100 μm and 250 μm. With this minimum base area, elevations can be created in a height of 50 μm to 80 μm, which then curve convexly in a dome-shaped manner over the base area with at the same time a smooth transition to the surface of the electronic component.

In a further embodiment of the invention, additional conductor tracks may also be provided between the rubber-elastic elevation and the electronic circuit, so that the rubber-elastic elevation can be disposed such that it is spaced apart from the electronic circuit by a wiring film.

A further embodiment of the invention provides that the rubber-elastic material of the elevations has over 50% elastic extensibility. A material of this type has the advantage that it can be compressed to over half its height or in the same way can be laterally displaced, so that the land on the crest is likewise displaceable with respect to the center point of the base area.

A further embodiment of the invention therefore provides that the rubber-elastic material of the elevation contains-an elastomer. Elastomers of this type act like natural rubbers and correspondingly allow themselves to be displaced with little expenditure of force both parallel to the surface of the electronic component and perpendicularly thereto.

A further embodiment of the invention provides that the rubber-elastic material contains a silicone-based elastomer. Silicone rubbers of this type are widespread and can be processed in different consistencies, so that a staggered configuration of silicone-based materials of different viscosities and different consistencies can be stacked one on top of the other, in order to realize an optimum dome-shaped contour with a smooth transition to the surface.

A further embodiment of the invention provides that the elevation of rubber-elastic material can be rubber-elastically deformed by several 10 μm. The rubber-elastic deformability by several 10 μm is particularly called for when electronic components are to be applied to contact terminals of printed circuit boards at wafer level for test purposes. On account of the thermal loading, it is quite possible that the semiconductor component may expand less than the contact terminal areas on the printed circuit board, so that displacements in the range of 50 μm to 150 μm are possible in the case of a diameter of the semiconductor wafer to be tested of 300 mm. The rubber-elastic elevations according to the invention can advantageously bridge or compensate for these high deflections.

In a further embodiment of the invention, the elevations can be deflected with respect to the surface in the vertical direction by at least 30 μm, which has the advantage that it is possible to compensate for tolerances caused by warpages of a semiconductor wafer or warpage of a printed circuit board of up to 150 μm.

For this purpose, in one embodiment of the invention the rubber-elastic elevation has a height of from 60 to 300 μm, so that, in the event of a rubber-elastic compression of up to 50%, the elevations can be advantageously compressed vertically with respect to the electronic component to 30 to 150 μm.

A further embodiment of the invention provides that the width of a conduction path of metal during the production of the elevation is less than or equal to 150 μm. This is intended at the same time to ensure that the metal path, which acts virtually like a metal spring supported by an elastomer and interacts with the land on the crest of the elevation, is not too wide and does not as a result reduce the flexibility or the rubber-elastic properties.

In a further embodiment of the invention, the electronic component has a semiconductor component, on the active upper side of which an insulating layer is applied, and the insulating layer merely leaves bonding channels exposed, via which contact areas on the semiconductor chip can be connected to the conductor tracks on the insulating layer. The conductor tracks on the insulating layer in turn are connected via the conduction paths on the sloping side of the rubber-elastic elevation to the land on the crest of the elevation.

Instead of a semiconductor component, the electronic component may also contain a polymer component, such as an electronic circuit on a printed circuit board, and the rubber-elastic elevations are then disposed directly on the printed circuit board.

A further embodiment of the invention provides that the lands can be soldered onto a printed circuit board. For this purpose, the lands may be coated with a thin solderable layer and/or the contact terminal areas on the printed circuit board may have such a solderable layer, so that an intensive bond can be realized by soft solder when the electronic component is applied to the printed circuit board. A further connection between the lands on the crest of the rubber-elastic elevations and contact terminal areas on a printed circuit board can be achieved by a conductive adhesive, which is applied for example to the lands of the crest of the elevation.

In a further embodiment of the invention, it is provided that the elevation is embedded with the land and the conduction path completely in a conductive adhesive. This complete embedment in the conductive adhesive may take place when the electronic component is mounted on a printed circuit board or a ceramic carrier, in that an appropriate conductive adhesive is applied to the contact terminal areas of the respective carrier material and subsequently spreads over the contour of the rubber-elastic elevation.

In the case of another embodiment of the invention, it is provided that the electronic component is disposed on a printed circuit board, is bonded on the printed circuit board by bumps of adhesive which shrink during curing and, by the at least one electrical contact of a rubber-elastic elevation forms a pressure contact with at least one contact terminal area on the printed circuit board. In the case of this embodiment of the invention, no solder material is used, and no conductive adhesive is required either, but instead the contact with respect to the contact terminal areas on a printed circuit board is brought about merely by applied pressure, which for its part takes place in turn by shrinkage of solder bumps of a shrinking adhesive. This embodiment of the invention has the advantage that mass production can be carried out in an inexpensive way, with the requirement to carry out at the highest speed and lowest cost possible the operations of disposing electronic components on printed circuit boards, mechanically attaching them, for example by the shrinking bumps of adhesive, and electrically connecting them, which occurs automatically when the shrinking bumps of adhesive cure.

As alternatives to a conduction path on the sloping side of the rubber-elastic elevation, it is also possible for a conduction path to be disposed in the interior of the rubber-elastic elevation between the conductive land and the electronic circuit. The conducting connection is consequently led from the land on the crest of the rubber-elastic elevation through the rubber-elastic elevation and to the electronic circuit.

In principle, the entire rubber-elastic or flexible elevation may also be produced from a flexible or rubber-elastic and electrically conducting material, so that the conducting connection is established not by a separate conduction path of a different material, but by the rubber-elastic material itself. For this purpose, very specific materials are necessary, imposing high requirements on the rubber-elastic materials both in selection and in composition. Such materials are generally of higher impedance than a pure conduction material that forms a conduction path. Consequently, in the case of the solution according to the invention, a single optimization of the respective flexible or rubber-elastic behavior and of the respective conduction behavior of the corresponding elevation is possible. In addition, a land formed as a metal region may be provided on the cap of the rubber-elastic elevation, with a conductor track leading away from the underside of the rubber-elastic elevation.

If further conductor tracks are provided between the electronic circuit and the rubber-elastic elevation, they may be disposed an insulating layer, which at least partly covers the first surface of the electronic component, with the insulating layer adjoining the rubber-elastic elevation. This has the advantage that a structuring of the conductor tracks can be performed by indirect structuring, that is by structuring of the insulating layer.

The electronic component may in principle take any suitable usable form. For instance, the component may be a semiconductor component or a polymer component. The land on the crest of the rubber-elastic elevation may also be formed in any desired way and be adapted to the respective specific use of the electronic component. For instance, an electrical contact may be supplemented by a conducting layer, a conducting pin or a conducting ball and consequently be adapted in an advantageous way to the requirements of the electronic component.

The rubber-elastic elevation is applied to the electronic component by a printing process, which can be carried out easily and at low cost. The requirements for the strength tolerances for such elevations can be satisfied by adapting the technically possible printing processes. Similarly, the insulating layer can also be applied by a printing process.

The conducting material for producing the conductor tracks or the conduction paths and the electrical contacts may be applied by sputter metallization or chemical metallization to the rubber-elastic elevation and to the insulating layer, respectively.

When applying the rubber-elastic elevation by a printing technique, screen printing is preferably used, in which the printing is performed through a perforated stencil. The perforated stencil can be optimized in such a way that the entire rubber-elastic elevation can already be formed through the perforated stencil by one printing process.

In a further way of carrying out the method, a number of successive printing operations are carried out through perforated stencils made to match one another, in order in this way to create in particular smooth transitions from the surface of the electronic component to the crest of the rubber-elastic elevation. For this purpose, perforated stencils that use a perforated metal foil are used. The perforated metal foil is made in such a way that its holes precisely match the position and the size of the rubber-elastic elevation, whereby an exact adaptation, of the dome-shaped formation of the rubber-elastic elevation can be achieved, with smooth transitions to the crest and to the base area.

In the case of a further example of how the method is carried out, it is provided that a perforated metal foil is used as a perforated mask. Perforated metal foils of this type can on the one hand be produced with extreme precision, on the other hand they do not have a fabric structure over the opening, as in the case of the screen printing process, to stabilize the screen printing net, but instead a completely open through-hole, making it easier to feed in the requisite amount of silicone rubber.

A further example of how the method is carried out provides that, during the production of the metal layer structure on the surface of the electronic component and on the rubber-elastic elevations, the conduction paths on the sloping sides of the elevations, the lands on the crests of the elevations and also the conductor tracks on the surface of the electronic component are produced simultaneously. For this purpose, it is envisaged first to apply a closed metal layer, which is possible by sputtering layers of metal such as, for example, copper-nickel or gold or their alloys, or can be achieved by electroplating or by vapor-depositing these metals. As a further step, a closed photoresist layer is then applied, it being difficult to apply a uniformly thin or thick layer of resist both on the planar or flat upper side of the electronic component and on the dome-shaped convexities of the elevations. A particularly favorable method here is that of spraying on or electrodepositing, in which a special photoresist can be uniformly deposited from an organometallic solution under current.

The exposing of the photoresist also presents difficulties, given the great differences in the level of the surface, especially since a high depth of focus must be achieved in order to achieve a well-defined delineation and exposure both in.:the region of the lands on the elevations and in the region of the conduction paths on the sloping side of the elevation and also then on the lower-lying planar upper side of the electronic component. In this embodiment of the method, projection exposure with parallel light beams is performed, and the photoresist is subsequently developed and the structure is cured to form a photoresist mask. After that, the metal layer can be structured through the photoresist mask by dry or wet etching. After structuring the metal layer, the photoresist mask is removed and the desired metal layer structure is left behind, containing lands on the crest of the elevation, conductor tracks on the sloping side of the elevations and connecting lines on the upper side of the electronic component.

For better adhesion of the metal coating both on the surface of the elevations and on the surface of the electronic component, nucleation may first take place on the insulating layer of the elevations and the insulating layer of the upper side of the semiconductor component. Only after that is metallization carried out in this region, in order to increase the adhesion of the conduction paths and the land on the rubber-elastic material of the rubber-elastic elevation.

As an alternative to this method, it is possible by laser treatment of the surface of the rubber-elastic elevation and, if appropriate, also of the insulating layer, or by some other suitable method, for the surface to be roughened, offering better adhesion for the conducting material of the metallization to be applied later. It may in this case also be provided that, before the metallization is applied and after the surface has been roughened, metal seeds or other suitable seeds, which may be formed of any suitable material, such as palladium, are applied to the rough surface. Palladium can be inexpensively deposited on electrically insulating materials and forms cubic seed crystals, which anchor themselves exceedingly well in the insulating material and consequently enhance adhesion for the conduction path or the conductor tracks.

The method for producing a metal layer structure described above can also be considerably improved if a method which works with an inkjet printing technique is used for the metal layer structure, it being possible by an organometallic solution as the ink and subsequent vaporization of the solvent during a heat-treatment operation to achieve a metal layer structuring which can achieve a metal structure on uneven surfaces such as the rubber-elastic elevations concerned without any masking technique, by programming of the inkjet printing process alone.

In a further embodiment of the invention, at least one electronic component according to the invention is bonded on a printed circuit board by an adhesive that shrinks as it cures. The shrinking adhesive establishes an electrical contact between the rubber-elastic elevation and its land and an electrical contact terminal area on the printed circuit board, so that a rubber-elastic pressure contact occurs. This embodiment has the advantage that it does not use solder containing lead, with the environmental impact this has, and that it is possible to compensate for unevennesses of the component. Finally, differences in the thermal expansion are compensated, so that thermally induced stresses are avoided.

For pressing the contact of the rubber-elastic elevation onto an electrical pressure-accepting area, the adhesive is applied to the printed circuit board in the form of individual bumps of adhesive. The electronic component is then aligned with its lands with respect to the electrical contact terminal areas of the printed circuit board and pressed onto the printed circuit board, so that the electrical lands on the crests of the rubber-elastic elevations contact the contact areas of the printed circuit board while the adhesive is curing, and shrinking as it does so. The method has the advantage that contacting and placement on a printed circuit board can be carried out at an extremely low curing temperature.

In the case of a further example of how the method is carried out, the adhesive is applied in the form of a surface-covering drop on the upper side of the printed circuit board and the electronic component is subsequently pressed with its rubber-elastically supported lands onto the contact terminal areas until the curing and shrinking of the adhesive has ended. Since temperatures in the range of 120 to 160° C. are intended for the curing of the adhesive, it is also possible to provide the lands or the contact terminal areas of the printed circuit board with a solderable layer before the electronic component is pressed into place, and to establish a soft-solder connection between the lands of the electronic component and the contact terminal areas of the printed circuit board at the same time as the shrinking adhesive is being pressed into place and cured.

The mounting of chip size packages (CSP), in particular geometrically large chips, on the board (or the printed circuit board) is difficult on account of the different coefficients of linear expansion of silicon and laminate. The invention overcomes the thermal mismatch in the CSP in an advantageous way.

The use of a CSP with an interconnect which is elastic in the z direction allows contacting which is possible even for many contacts and very large chips to be accomplished by a pressing operation. The pressing operation can be accomplished by the chip being adhesively attached onto the board in a punctiform manner with an adhesive that shrinks as it cures and consequently moves the chip and board toward each other. During this operation, the elastic interconnect elements (or rubber-elastic elevations) are connected to the pad (or the contact terminal area) by a pressing force. In this way it is possible to compensate for the different heights of the interconnect elements and for a secure connection to be obtained. With the aid of the rubber-elastic elevations, wafers can be made to bow by up to 10 µm per cm. In the case of chip sizes of 30 mm, this results in that a tolerance of up to 30 µm can be compensated by the rubber-elastic elevations.

The advantages of this method are that it processes at a comparatively low temperature (<200° C.), the freedom from lead of the compound (green components), and the elasticity not only in the x/y but also in the z direction under thermomechanical loading (board distortion).

With the present invention, the use of CSP with interconnect elements which are elastic in all three directions is made easier. By the use of shrinking adhesives, a more reliable electrical contact between the chip and the board is achieved, in particular for large chips and high pin numbers.

Other features which are considered as characteristic for the invention are set forth in the appended claims.

Although the invention is illustrated and described herein as embodied in a electronic component with flexible contacting pads and a method for producing the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a cross-sectional view of a detail of a semiconductor chip after an insulating layer has been printed on;

FIG. 9 is a cross-sectional view of the semiconductor chip according to FIG. 2 after a rubber-elastic elevation has been printed on;

FIG. 11 is a cross-sectional view of the semiconductor chip according to FIG. 9 after a second metallization has been applied;

FIG. 12 is a cross-sectional view of the semiconductor chip according to FIG. 10 after a solder ball has been applied to the land;

FIG. 13 is a cross-sectional view of a further embodiment of a conduction path;

FIG. 14 is a cross-sectional view of a further embodiment of the invention;

FIG. 15 is a cross-sectional view of a multi-layered printed circuit board with a soldered-on electronic component;

FIG. 19 is cross-sectional view of a multi-layered printed circuit board with a spread-out drop of a shrinkable adhesive;

FIG. 20 is a cross-sectional view of a multi-layered printed circuit board with an applied and aligned electronic component; and FIG. 21 is a cross-sectional view of a multi-layered printed circuit board with a pressed-on electronic component during the curing of the adhesive.

DESCRIPTION OF THE PREFERRED EMBODIMENTS

Figure 1:
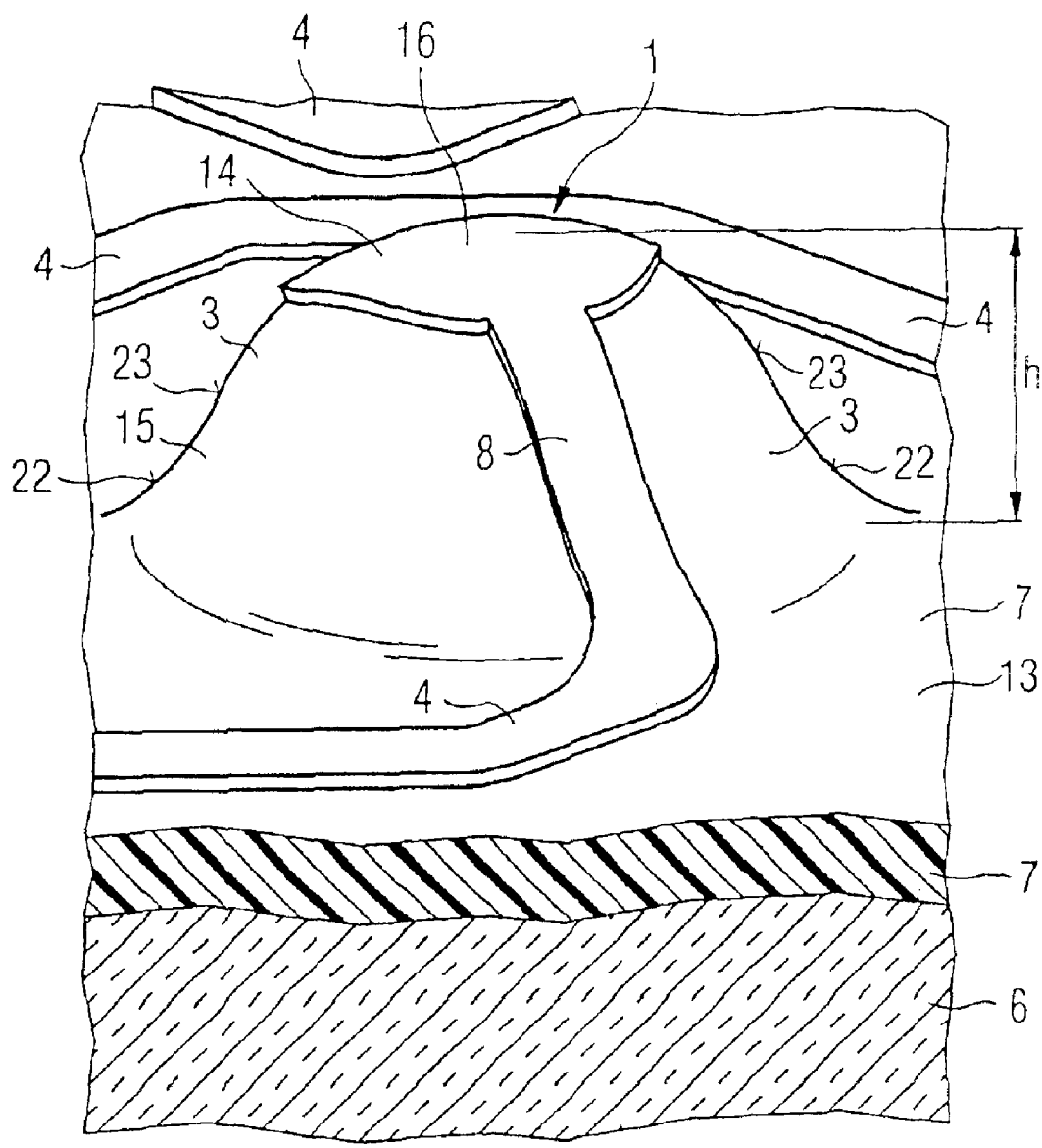
FIG. 1 is a diagrammatic, partial perspective and partial cross-sectional view of an embodiment according to the invention.

Referring now to the figures of the drawing in detail and first, particularly, to FIG. 1 thereof, there is shown a perspective view of an embodiment of the invention with a partial cross sectional view. A piece of a surface 13 of an electronic component 2 is depicted, the cross section disposed thereunder substantially showing a semiconductor chip 6 with an insulating coating 7. Disposed on the surface 13 of the insulating coating 7 is a structured layer of metal, which contains conductor tracks 4. Furthermore, disposed directly on the surface 13 is a rubber-elastic elevation 3, which convexly curves in a dome-shaped manner over the surface 13 and has a contour 15 which, with a gentle curvature, merges into the surface 13. Disposed on a crest 14 of the rubber-elastic elevation 3, at a height h away from the surface 13, is a metal land 16, which forms an electrical contact 1 of the electronic component 2 on the crest 14 of the rubber-elastic elevation 3. Disposed between one of the conductor tracks 4 on the surface 13 and the land 16 on the crest 14 of the rubber-elastic elevation 3 is a conduction path 8, which can extend in a width of up to 150 μm over the sloping side 15 of the rubber-elastic elevation 3. On account of the gentle curvatures 22 of the rubber-elastic elevation 3, the material of the conduction path 8 is subjected only to flexural loading when the rubber-elastic elevation 3 is compressed or displaced, and consequently protected from microcrack formations. In the embodiment, the height h of the rubber-elastic elevation 3 lies between 60 and 300 μm. A base area of the rubber-elastic elevation 3 has a diameter of over 150 μm to 500 μm. In this embodiment, the width of the conduction path lies between 30 μm and 150 μm.

The components 2 which are provided with the rubber-elastic elevations 3 according to the invention as external contacts and have a relatively large semiconductor chip 6, for example of an edge length of 20 mm, can be subjected during thermal cycling at test temperatures between −40° C. and +160° C. to a relative displacement with respect to a printed circuit board of over 30 μm in the horizontal direction without causing the electrical connection to be torn off.

If the components 2 are already tested at the wafer level, the rubber-elastic elevation 3 can still compensate for differences in height in the vertical direction of up to 150 μm. In the case of such test procedures at wafer level, reliable electrical connections are simultaneously created for up to 2000 electronic components 2 to in each case 50 to 100 external contacts on the rubber-elastic elevations 3 of a semiconductor wafer just by pressing the lands 16 of the elevation onto contact terminal areas of a test board. In the process, the rubber-elastic elevations 3 compensate not only for warpages of the test board of +/−10 μm and of the semiconductor wafer, but also differences in height between the elevations of up to +/−10%. On account of the high rubber-elastic extensibility of the elevations 3 of 50%, it is possible to compensate completely for these differences in the vertical direction.

Figure 2:
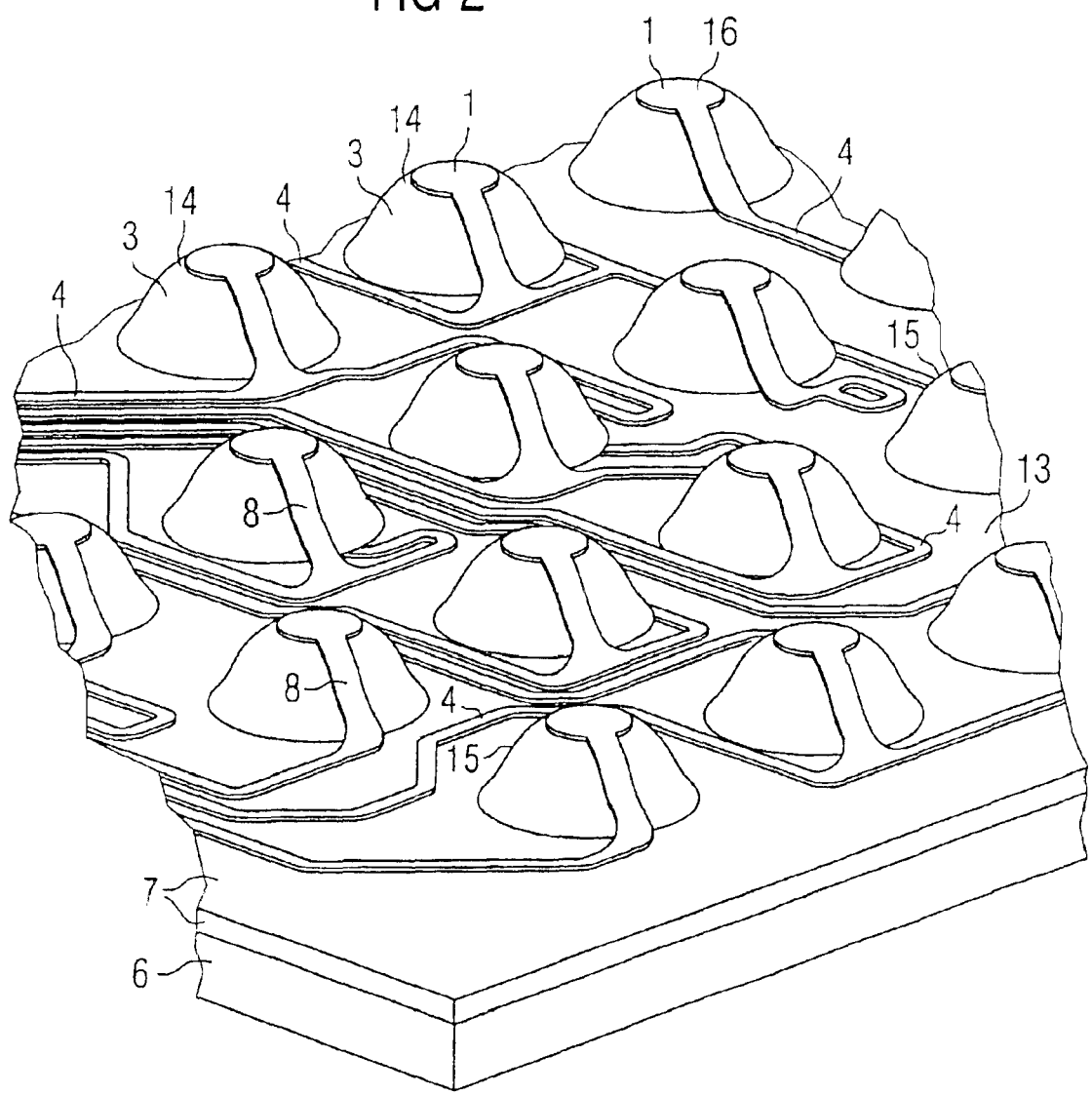
FIG. 2 is a partial perspective view of part of an electronic component according to a further embodiment of the invention.

FIG. 2 shows a perspective view of part of the electronic component 2 according to a further embodiment of the invention. Components with the same functions as in FIG. 1 are identified by the same reference numerals and are not separately explained. As FIG. 2 shows, it is possible to dispose a number of the rubber-elastic elevations 3 with the lands 16 on their crests 14 and the conduction paths 8 on their sloping sides 15. On the upper side 13 of the insulating layer 7, the metal conductor tracks 4 run between the rubber-elastic insulating elevations 3 and lead to corresponding non-illustrated lands in a bonding channel of the semiconductor chip 6. The insulating layer 7 is therefore also referred to as a wiring layer and the conductor tracks 4 represent the wiring lines.

Figure 3:
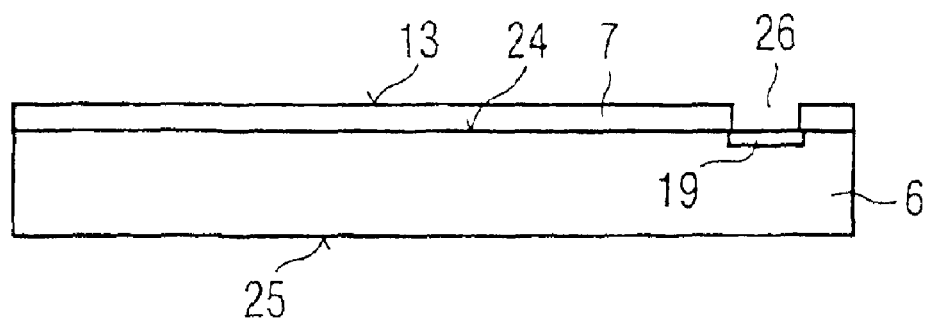
FIG. 3 is a cross-sectional view of a starting material.
Figure 4:
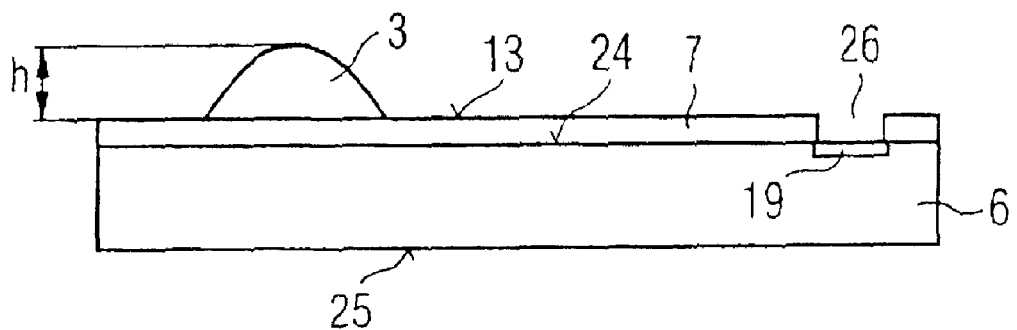
FIG. 4 is a cross-sectional view through a rubber-elastic elevation of an embodiment of the invention.
Figure 5:
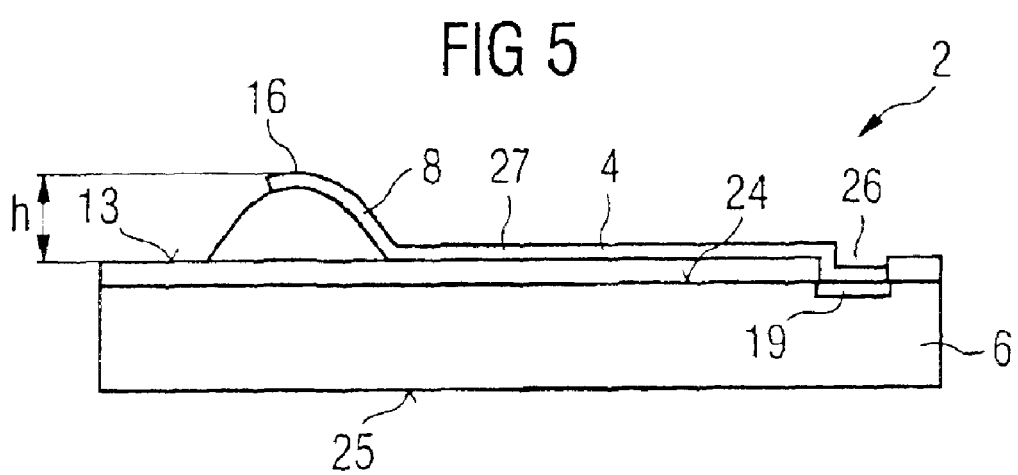
FIG. 5 is a cross-sectional view through a metal-coated rubber-elastic elevation.

FIGS. 3 to 5 represent the method steps for producing the electronic component 2 of this type.

FIG. 3 shows a diagrammatic, cross-sectional view of the starting material for the present invention. Components with the same functions as in the previous figures are identified by the same reference numerals and are not separately explained. A starting material for the present invention is a semiconductor chip 6 with contact areas 19 of an integrated circuit on an active upper side 24 of the semiconductor chip 6, which lies opposite from a passive rear side 25. Disposed on the semiconductor chip 6 is an insulating layer 7, with a surface 13 leaving a bonding channel 26 exposed, which allows access to the contact areas 19 of the semiconductor chip 6.

FIG. 4 shows a diagrammatic cross-sectional view through the rubber-elastic elevation 3 of an embodiment of the invention. Components with the same functions as in the previous figures are identified by the same reference numerals and are not separately explained. The rubber-elastic elevation 3, which are formed of a rubber-elastic elastomer, is applied to the surface 13, which at the same time also represents a surface of the electronic component 2, directly on the insulating layer 7. In the embodiment of FIG. 4, a silicone-based material was used as the rubber-elastic elastomer, are applied to the surface 13 of the insulating layer 7 via a perforated stencil. The stencil itself contains a perforated metal foil. The height h of the dome-shaped rubber-elastic elevation 3 can be specifically adjusted by adjusting the viscosity and composition of the silicone rubber compound.

FIG. 5 shows a diagrammatic, cross-sectional view through a metal-coated rubber-elastic elevation 3. Components with the same functions as in the previous figures are identified by the same reference numerals and are not separately explained. A metal layer structure, which substantially contains the land 16 on the crest of the rubber-elastic elevation 3, the conduction path 8 on the sloping side 15 of the rubber-elastic elevation 3 and the conductor track 4, which connects the land 16 to the contact area 19 on the semiconductor chip 6 in the bonding channel 26, is applied to the surface 13 of the insulating layer and also to the surface of the rubber-elastic elevation 3 and in the bonding channel 26. Applying the metal structure essentially completes the electronic component 2, although the entire component with the exception of the rubber-elastic elevation 3 with the land 16 on the crest of the elevation 3 can be provided with a non-illustrated protective layer of an insulating material.

The metal structure is produced in the embodiment according to FIG. 5 with the aid of a metallization of the entire surface, the metallization subsequently being structured by a photolithographic process. The photolithographic process solves two problems; on the one hand, that of applying a uniformly thick photoresist layer to the metal coating on an uneven surface predefined by the convex elevations. While the metal coating can be applied with a relatively uniform thickness by sputtering, the photoresist layer can be galvanically deposited either by a spraying technique or by electrodeposition in an organometallic solution. In both cases, a relatively uniform coating thickness of the photoresist is obtained. The second problem is that of exposing an uneven surface area of this type, with the aim of achieving a uniform definition of the delineation both on the crest of the rubber-elastic elevation 3 and on the plane of the insulating layer 7. The problem is solved by projection exposure.

The problem of applying a precise metal layer structure to an uneven surface area is achieved in a further example of how the method is carried out in FIG. 5 by the metal layer structure 27 being printed. In the case of the conventional screen printing technique or the perforated mask technique, however, an obstacle is presented by the considerable differences in the height h, i.e. the great unevenness of the surface area to be printed on. The problem is overcome by inkjet printing of the metal layer structure with an ink which is composed of an organometallic solution. After the printing, the solvent is vaporized by an appropriate heat-treatment operation, thereby forming a metal layer structure.

Figure 6:
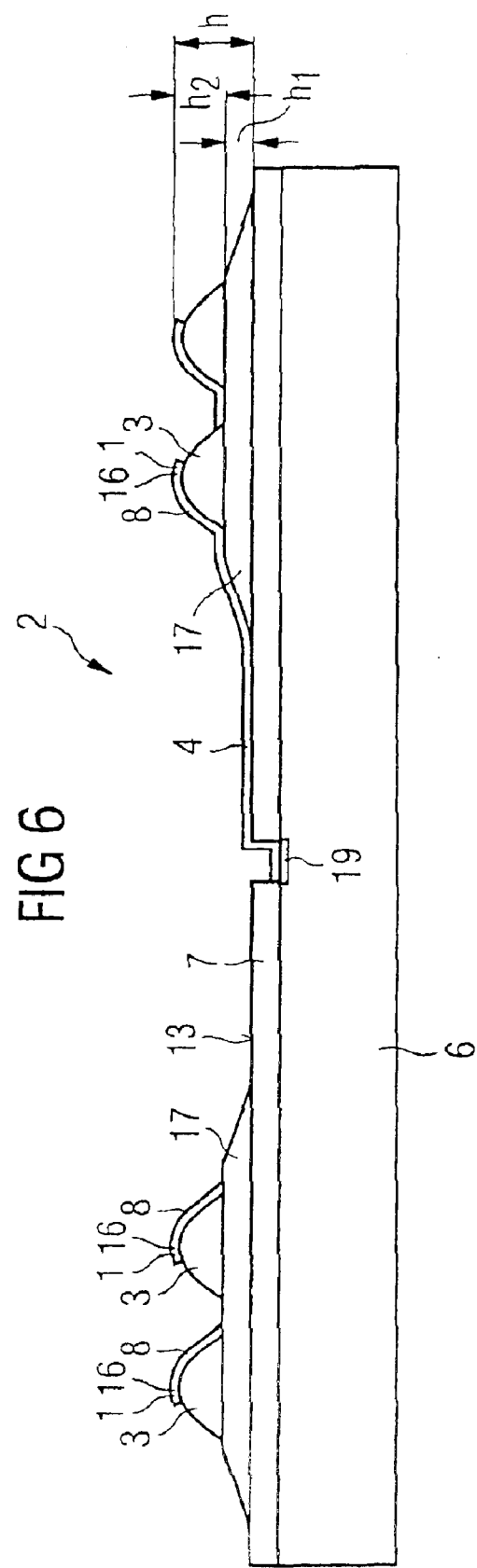
FIG. 6 is a cross-sectional view through a number of rubber-elastic elevations on a rubber-like base.

FIG. 6 shows a diagrammatic, cross-sectional view through a number of the rubber-elastic elevations 3 on a rubber-elastic base 17. Components with the same functions as in the previous figures are identified by the same reference numerals and are not separately explained. The electronic component 2 can be produced by the same steps as are represented in FIGS. 3 to 5, except that, before the rubber-elastic elevations 3 are applied, first an interim step for producing the flat bases 17 from a rubber-elastic material is carried out. For the interim step for forming the flat rubber-elastic bases 17, screen printing can be carried out, with correspondingly larger openings in the stencil, so that a number of rubber-elastic elevations 3 can be subsequently applied on the base 17. In this embodiment of the invention, the height $h_1$ of the rubber-elastic base is between 30 and 50 μm, while the height $h_2$ corresponds to the height h of the rubber-elastic elevation in FIGS. 4 and 5.

Figure 7:
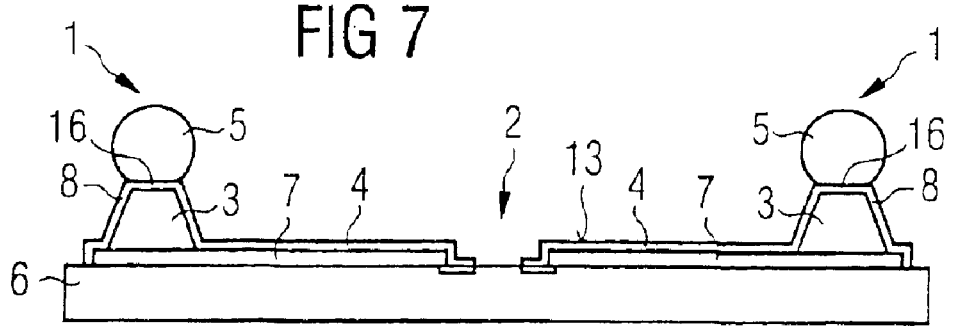
FIG. 7 is a cross-sectional view of an overall view of a component according to a further embodiment of the invention.

FIG. 7 schematically shows an overall cross section of the electronic component 2 of a further embodiment of the invention, in this case the rubber-elastic elevations 3 being represented at the edge of the electronic component 2 and the conductor tracks 4 leading to the corresponding contact areas 19 of an non-illustrated electronic circuit in the semiconductor chip 6. Further elevations may be disposed in a distributed manner over the entire surface 13. The conduction paths 8 connect the conductor tracks 4 on the surface 13 to the lands 16 on the crests 14 of the elevations 3, which carry contact balls 5. The contact balls 5 may be gold-plated, in order to ensure an oxidation-free contact with respect to contact terminal areas 12 of a printed circuit board. In this case, an electrical connection between the circuit of the component 2 and the wiring on the printed circuit board 10 is achieved by an oxidation-free flexible pressure contact, so that no use is made of solder, with its environmental impact. However, it is also possible for the rubber-elastic elevations 3 to carry the solder ball 5, so that a soldered connection to the printed circuit board 10 is made possible and the elastic elevations 3 not only compensate for the unevennesses of the component 2 and the printed circuit board but also reduce thermal stresses which occur on account of different coefficients of expansion of the component 2 and the printed circuit board 10.

Figure 8:
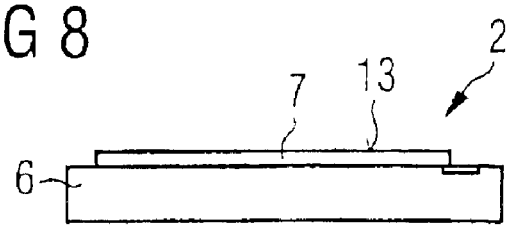

In FIGS. 8 to 13, the production of the electronic component 2 that has the rubber-elastic elevation 3 according to the invention is explained by way of example. As FIG. 8 shows, this involves first applying to the semiconductor chip 6, which in FIG. 2 is represented as a detail in cross section, the insulating layer 7, which at least partly covers a first surface of the semiconductor chip 6. The application and structuring of the insulating layer 7 may in this case be performed by different methods. In one embodiment of the invention, a printing method is used, in particular a screen printing method, which can be carried out easily and at low cost.

Figure 9:
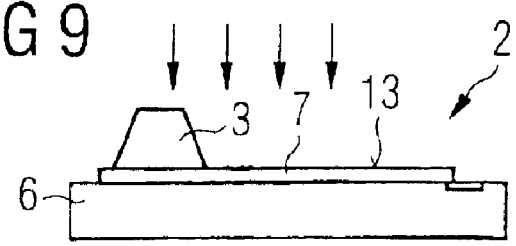

FIG. 9 shows how the rubber-elastic elevation 3 is subsequently applied to the semiconductor chip 6 in the region of its surface 13, it being possible for the rubber-elastic elevation 3 to be disposed on or alongside the insulating layer 7.

Roughening of the surface of the flexible elevation 3 and of the insulating layer 7 with the aid of a laser can be performed in the regions in which the conduction paths 8 and the conductor tracks 4 are to be formed in a later step. This is indicated in FIG. 9 by the vertical arrows. The rough surface in this case provides in particular better adhesion of the conducting material of the conduction paths 8 and the conductor tracks 4 on the respective surfaces.

Figure 10:
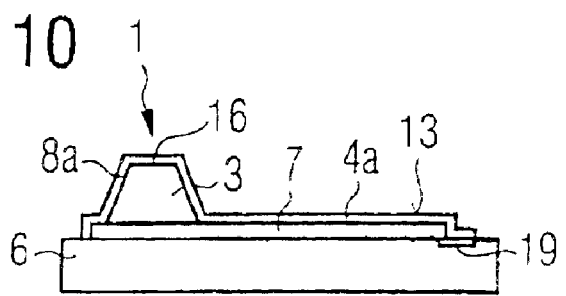
FIG. 10 is a cross-sectional view of the semiconductor chip according to FIG. 9 after a first metallization has been applied.

FIG. 10 shows a cross section of a detail of the semiconductor chip according to FIG. 9 after a structured metallization has been applied to the surface of the rubber-elastic elevation 3 and to the surface 13 of the insulating layer 7.

FIG. 11 shows a cross section of a detail of the semiconductor chip 6 according to FIG. 10 after a second metallization has been applied. As FIGS. 10 and 11 show, the metallization is consequently performed in two steps, with a first base metallization 4a and 8a first being produced or seeds 4a, 8a being deposited on the surface, respectively serving for forming the conductor tracks on the insulating layer and the conduction path on the flexible elevation. The seeds may be formed of any suitable material, such as palladium. Subsequently, a final metallization 4b and 8b is performed, as shown in FIG. 11, for the final production of the conductor tracks 4 and the conduction paths 8. The structured metallization already forms on the rubber-elastic elevation 3 the land 16, via which the contacting of the electronic component 2 can take place.

FIG. 12 shows a cross section of a detail of the semiconductor chip 6 according to FIG. 10 after a solder ball 5 has been applied to the contact pad that forms the electrical land 16.

FIG. 13 shows a cross section of an alternative embodiment of the conducting connection with respect to the contact pad on the rubber-elastic elevation 3, with a conduction path 9 being led here through the rubber-elastic elevation 3. Such a configuration can be produced by, as in FIG. 8, by applying the insulating layer 7 to the semiconductor chip 6. Subsequently, a metallization is already performed to produce the conductor tracks 4 on the insulating layer 7. Only then is the flexible elevation 3 applied, preferably by a printing process. Finally, the formation of the conduction path 9 in the interior of the rubber-elastic elevation 3 takes place by laser structuring, starting from the surface of the rubber-elastic elevation 3, with subsequent metallization.

FIG. 14 shows a diagrammatic cross-sectional view of a further embodiment of the invention. Components with the same functions as in the previous figures are identified by the same reference numerals and are not separately explained. In this embodiment of the invention, the rubber-elastic elevation 3 is formed from a simultaneously electrically conducting material and has on its crest 14 the metal land 16, which is connected via the electrically conducting material of the rubber-elastic elevation 3 at the foot of the elevation 3 to the conductor track 4 on the surface 13 of the electronic component. The rubber-elastic elevation 3 serves in this case at the same time as a low-impedance protective resistor.

FIG. 15 shows a diagrammatic, cross-sectional view of a multi-layered printed circuit board 10 with a soldered-on electronic component 2. For this purpose, the multi-layered printed circuit board 10 has on its upper side 28 contact terminal areas 12, which carry a coating of soft solder. Components with the same functions as in the previous figures are identified by the same reference numerals and are not separately explained.

In the case of this configuration of the invention, the electronic component 2 is soldered, with its lands 16 on the crests 14 of the rubber-elastic elevations 3, on the contact terminal areas 12 of the printed circuit board 10 and can compensate with its rubber-elastic elevations both for thermal differences in the expansion of the printed circuit board 10 with respect to the semiconductor chip 6 and for warpages of the surfaces 13 of the electronic component 2 with respect to the surface 28 of the printed circuit board 10. The height compensation between the two surfaces may require a rubber-elasticity amounting to 1 $\mu$m over a centimeter, and consequently, in the case of a semiconductor wafer with semiconductor chips 6 of 30 cm in diameter, can compensate for a difference in the distance between the two surfaces 13 and 28 of up to 30 $\mu$m. In the case of this embodiment of the invention, the rubber-elastic extensibility of the rubber-elastic elevations 3 vertically with respect to the surface 13 may contain a rubber-elastic extension of 30 $\mu$m. The rubber-elastic material of the elevations 3 has a rubber-elastic extensibility of 50%. Consequently, the height h of the rubber-elastic elevations 3 is at least 60 $\mu$m.

Figure 16:
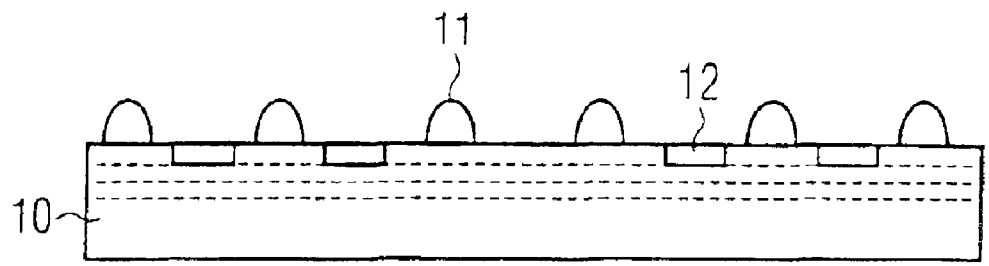
FIG. 16 is a cross-sectional view of a multi-layered printed circuit board with bumps of adhesive.

FIG. 16 shows a cross-sectional view of the multi-layered printed circuit board 10 with bumps of adhesive 11 and the contact terminal areas 12, which may be gold-plated, in order to ensure an oxidation-free contact, or may be coated with solder, if a soldered connection is desired.

Figure 17:
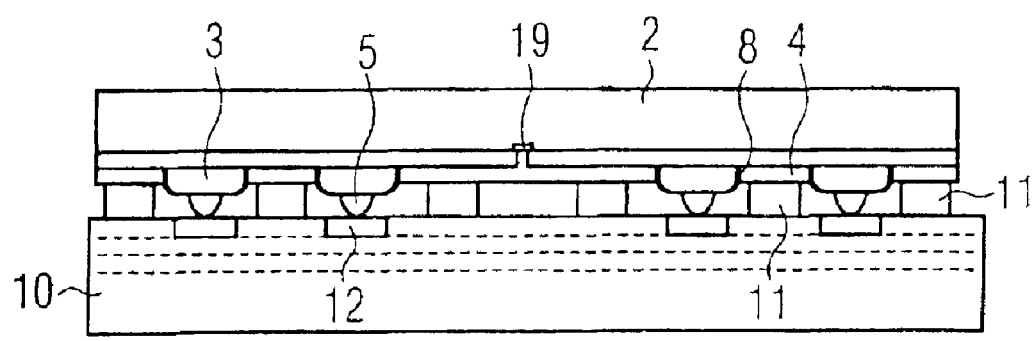
FIG. 17 is a cross-sectional view of the multi-layered printed circuit board shown in FIG. 16 together with an electronic component.
Figure 18:
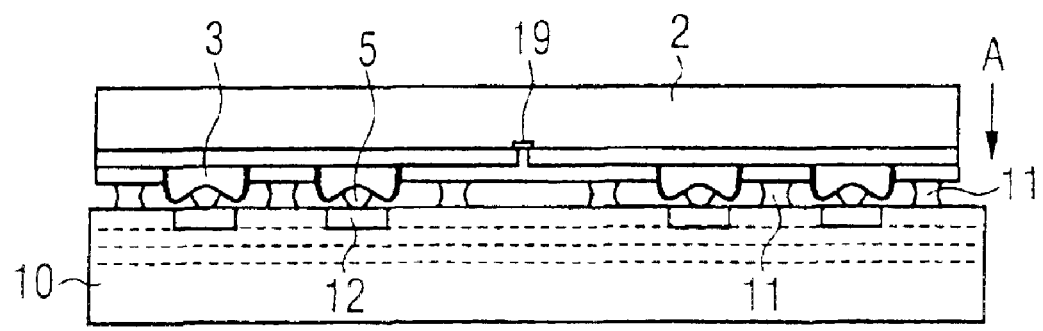
FIG. 18 is a cross-sectional view of a mounted electronic component of a further embodiment of the invention on a printed circuit board.

FIG. 17 shows the application of the electronic component 2, as it is shown in FIG. 7, but with four contact balls 5, which have been applied to rubber-elastic elevations 3 and are in connection via the conduction paths 8 with the conductor tracks 4 of the electronic component 2. When the electronic component 2 is applied and adjusted on the multi-layered printed circuit board 10, the bumps of adhesive 11 are deformed somewhat and, as is shown in FIG. 18, they shrink during curing, so that the electronic component 2 is pressed with its contact balls 5 onto the contact terminal areas 12 of the printed circuit board 10 in the direction of the arrow A, with the rubber-elastic elevation 3 being compressed at the same time. If both the contact balls 5 and the contact terminal areas 12 are gold-plated with a gold alloy, an oxidation-free ohmic contact between the components involved is produced by the pressure applied in the direction of the arrow A. If the components are coated with solder, a soldered connection can also be established under appropriate soldering temperatures.

FIG. 18 shows the mounted component 2 of a further embodiment of the invention on the printed circuit board 10. The flexible elevations 3 can compensate in a stress-free manner for unevennesses and warpages of the electronic component 2, up to 10 $\mu$m per cm, and unevennesses of the printed circuit board 10.

FIGS. 19 to 21 then show in detail the attachment of the electronic component 2 onto the multi-layered printed circuit board 10 prepared with a spread-out drop of shrinkable adhesive.

FIG. 19 shows a diagrammatic, cross-sectional view of a multi-layered printed circuit board 10 with a spread-out drop 21 of a shrinkable adhesive. Components with the same functions as in the previous figures are identified by the same reference numerals and are not separately explained.

Unlike in FIG. 16, in the case of the embodiment of the invention according to FIG. 19, for mounting the electronic component 2 onto the multi-layered printed circuit board 10, the drop of shrinkable adhesive 21 covering a large area is spread out on the upper side 28 of the multi-layered printed circuit board 10.

FIG. 20 shows a schematic cross-sectional view of the multi-layered printed circuit board 10 with an applied and aligned electronic component 2. Components with the same functions as in the previous figures are identified by the same reference numerals and are not separately explained. The electronic component 2 differs from the electronic component which is shown in FIG. 15 in that a protective layer 29 has been additionally applied, leaving the rubber-elastic elevations 3 with their lands 16 on their crests 14 and the conduction paths 8 on the sloping sides 15 of the rubber-elastic elevations 3 exposed.

When the lands 16 enter the drop 21 of shrinkable adhesive 21 spread out on the printed circuit board 10, the drop of adhesive is displaced by the contact terminal areas 12 of the printed circuit board 10, so that a contact is produced between the lands 16 and the contact terminal areas 12. This electrical contact is intensified by the fact that, in the shrinking process of the adhesive, the latter presses the electronic component 2 in the direction of the arrow A onto the contact terminal areas.

FIG. 21 shows a diagrammatic, cross-sectional view of the multi-layered printed circuit board 10 with the pressed-on electronic component 2 during the curing of the adhesive. Components with the same functions as in the previous figures are identified by the same reference numerals and are not separately explained.

During the curing of the adhesive between the electronic component 2 and the printed circuit board 10, the adhesive shrinks and draws the electronic component 2 with its rubber-elastic elevations and the lands 16 located on them in the direction of the arrow A onto the contact terminal areas 12 of the printed circuit board 10. Consequently, an intensive electrical contact can be established just by making contact. In this operation, the protective layer 29 protects the electronic component 2 from being influenced or damaged by the shrinkable adhesive. The curing temperature of the shrinkable adhesive lies in a temperature range which at the same time allows soft soldering between the lands 16 of the electronic component and the contact terminal areas 12 of the printed circuit board 10. Consequently, with this embodiment of the invention it is possible to create both electrical contact pads which are based only on touching and/or contact pads which are additionally secured mechanically by soft soldering.

We claim:

1. An electronic component comprising:
   a chip having a surface and an electronic circuit;
   conductor tracks disposed on said surface;
   metal-coated elevations formed of an insulating material disposed on said surface, said metal-coated elevations having a dome-shaped contour with a gently curved transition to said surface, said metal-coated elevations formed of a rubber-elastic material and having crests, sloping sides, and metal lands with each of said metal-coated elevations having a metal land, a crest and a sloping side, said metal land being disposed on said crest; and
   conduction paths, one of said conduction paths disposed on each of said sloping sides and connected between said land and one of said conductor tracks, and said metal lands electrically connected to said electronic circuit through said conduction paths and said conductor tracks.

2. The electronic component according to claim 1, further comprising a rubber-elastic flat base area disposed on said chip, a number of said metal-coated elevations disposed on said rubber-elastic flat base area, and a respective conduction path extending from said metal land over said sloping side of a respective metal-coated elevation and over said rubber-elastic flat base area to one of said conductor tracks on said surface.

3. The electronic component according to claim 1, wherein said metal-coated elevations each have a base area with a diameter of between 150 and 500 $\mu$m.

4. The electronic component according to claim 1, further comprising an insulating layer at least partly covering an active surface of said chip and adjoins said metal-coated elevations, said conductor tracks disposed on said insulating layer forming a conducting connection between said conduction paths, said metal-coated elevations and said chip.

5. The electronic component according to claim 1, wherein said rubber-elastic material of said metal-coated elevations has over 50% rubber-elastic extensibility.

6. The electronic component according to claim 1, wherein said rubber-elastic material of said metal-coated elevations contains an elastomer.

7. The electronic component according to claim 1, wherein said rubber-elastic material contains a silicone-based elastomer.

8. The electronic component according to claim 1, wherein said metal-coated elevations formed of said rubber-elastic material can be rubber-elastically deformed by several 10 $\mu$m.

9. The electronic component according to claim 1, wherein said metal-coated elevations can be rubber-elastically deflected parallel to said surface by up to 50 $\mu$m.

10. The electronic component according to claim 1, wherein said metal-coated elevations can be deflected vertically with respect to said surface by 50 $\mu$m to 150 $\mu$m.

11. The electronic component according to claim 1, wherein said metal-coated elevations have given height of between 60 $\mu$m to 300 $\mu$m.

12. The electronic component according to claim 1, wherein said conduction paths have a given width on said sloping sides of said metal-coated elevations being less than or equal to 150 $\mu$m.

13. The electronic component according to claim 1, wherein the electronic component is a semiconductor component.

14. The electronic component according to claim 1, wherein the electronic component is a polymer component.

15. The electronic component according to claim 3, wherein said metal-coated elevations are electrically conducting and are electrically connected by said base area to said conductor tracks on said surface.

16. The electronic component according to claim 1, further comprising:
    a conductive adhesive; and
    a printed circuit board having contact terminal area and said metal lands are electrically connected to said contact terminal areas of said printed circuit board by said conductive adhesive.

17. The electronic component according to claim 1, further comprising a conductive adhesive completely embedding said metal-coated elevations with said metal lands and said conduction paths.

18. The electronic component according to claim 1, further comprising:
    a printed circuit board having contact terminal area; and
    bumps of adhesive disposed on said printed circuit board, said chip bonded to said printed circuit board by said bumps of adhesive which shrink during curing and, at least on of said metal lands of said metal-coated elevations forms a pressure contact with at least one of said electrical contact terminal areas of said printed circuit board.

19. A method for producing an electronic component, which comprises the steps of:
    providing a chip having a surface and an electronic circuit;
    using a printing process for applying elevations formed of a rubber elastic material on the surface, the elevations having crests, sloping sides and a dome-shaped contour with a gently curved transition to said surface;
    disposing conductor tracks on the surface;
    forming metal lands on the crests; and
    forming conduction paths disposed on the sloping sides for connecting the metal lands to the conductor tracks, the conduction paths and the conductor tracks providing a connection between the metal lands and the electronic circuit.

\* \* \* \* \*

UNITED STATES PATENT AND TRADEMARK OFFICE
CERTIFICATE OF CORRECTION

PATENT NO. : 6,897,568 B2
DATED : May 24, 2005
INVENTOR(S) : Alfred Haimerl et al.

It is certified that error appears in the above-identified patent and that said Letters Patent is hereby corrected as shown below:

Column 16,
Claims 20-38 should be included as follows:

-- 20. The method according to claim 19, which comprises performing the printing process using screen printing through a perforated stencil.

21. The method according to claim 19, which comprises creating the elevations by a number of successive printing operations through perforated stencils made to match one another.

22. The method according to claim 20, which comprises using a perforated metal foil as the perforated stencil.

23. The method according to claim 19, which comprises producing a metal layer structure for forming the conduction paths, the metals lands on the elevations, and the conductor tracks on the surface, simultaneously.

24. The method according to claim 23, which comprises producing the metal layer structure by the following steps:

applying a closed metal layer to the surface and to the elevations by a method selected from the group consisting of sputtering, electroplating and vapor-depositing;

applying a closed photoresist layer to the closed metal layer by one of spraying on and electrodepositing;

projection-exposing, developing and curing the photoresist layer to form a structured photoresist mask;

structuring the closed metal layer by one of dry etching and wet etching and;
removing the photoresist mask, leaving behind the closed metal layer structure defining the conduction paths, the metal lands on the elevations, and the conductor tracks on the surface.

UNITED STATES PATENT AND TRADEMARK OFFICE
CERTIFICATE OF CORRECTION

PATENT NO. : 6,897,568 B2
DATED : May 24, 2005
INVENTOR(S) : Alfred Haimerl et al.

It is certified that error appears in the above-identified patent and that said Letters Patent is hereby corrected as shown below:

Column 16 (cont'd),

25. The method according to claim 19, which comprises after applying the elevations, forming a roughened surface by roughening a surface of the elevations at least in a region of where the conduction paths are to be formed.

26. The method according to claim 25, which comprises after the roughening of the surface of the elevations and before an application of a conducting material for forming the conduction paths on the sloping sides of the elevations, depositing seeds on a surface of the elevations.

27. The method according to claim 26, which comprises forming the seeds from palladium.

28. The method according to claim 25, which comprises depositing a conducting material on the roughened surface for forming the conduction paths on the sloping sides of the elevations.

29. The method according to claim 19, which comprises:

applying an insulating layer to the surface; and roughening a surface of the insulating layer at least in a region of the conductor tracks to be formed.

30. The method according to claim 29, which after the roughening of the surface of the insulating layer and before an application of a conducting material for forming conductor tracks on the surface of the insulating layer, depositing seeds on the surface of the insulating layer.

31. The method according to claim 30, which comprises forming the seeds from palladium.

32. The method according to claim 19, which comprises:

applying an insulating layer to the surface; and

UNITED STATES PATENT AND TRADEMARK OFFICE
CERTIFICATE OF CORRECTION

PATENT NO. : 6,897,568 B2
DATED : May 24, 2005
INVENTOR(S) : Alfred Haimerl et al.

It is certified that error appears in the above-identified patent and that said Letters Patent is hereby corrected as shown below:

Column 16 (cont'd), using a laser for roughening a surface of the insulating layer at least in a region of the conductor tracks to be formed.

33. The method according to claim 19, which comprises using an adhesive bonding at least the chip onto a printed circuit board, with the metal lands on the elevations being processed onto contact terminal areas of the printed circuit board.

34. The method according to claim 33, which comprises using a special adhesive which shrinks as it cures as the adhesive.

35. The method according to claim 33, which comprises disposing the adhesive on the printed circuit board in a form of bumps of the adhesive.

36. The method according to claim 34, which comprises applying the adhesive in form of a surface covering drop on an upper side of the printed circuit board and the chip is subsequently pressed with the lands onto the contact terminal areas until a curing and shrinking of the adhesive has ended.

37. The method according to claim 19, which comprises after applying the rubber-elastic elevation, using a laser for roughening a surface of the elevations at least in a region where the conduction paths are to be formed.

UNITED STATES PATENT AND TRADEMARK OFFICE
CERTIFICATE OF CORRECTION

PATENT NO. : 6,897,568 B2
DATED : May 24, 2005
INVENTOR(S) : Alfred Haimerl et al.

It is certified that error appears in the above-identified patent and that said Letters Patent is hereby corrected as shown below:

Column 16 (cont'd),

38. A method for producing a metal layer structure having elevations and depressions on flat surfaces, which comprises the step of:

forming a metal layer in a selective and structured manner by inkjet printing by use of an organometallic solution as ink and subsequent vaporization of a solvent during heat treatment operation. --.

Signed and Sealed this

Twenty-ninth Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,897,568 B2
DATED : May 24, 2005
INVENTOR(S) : Alfred Haimerl et al.

It is certified that error appears in the above-identified patent and that said Letters Patent is hereby corrected as shown below:

<u>Column 16,</u>
Claims 20-38 should be included as follows:

-- 20. The method according to claim 19, which comprises performing the printing process using screen printing through a perforated stencil.

21. The method according to claim 19, which comprises creating the elevations by a number of successive printing operations through perforated stencils made to match one another.

22. The method according to claim 20, which comprises using a perforated metal foil as the perforated stencil.

23. The method according to claim 19, which comprises producing a metal layer structure for forming the conduction paths, the metals lands on the elevations, and the conductor tracks on the surface, simultaneously.

24. The method according to claim 23, which comprises producing the metal layer structure by the following steps:

applying a closed metal layer to the surface and to the elevations by a method selected from the group consisting of sputtering, electroplating and vapor-depositing;

applying a closed photoresist layer to the closed metal layer by one of spraying on and electrodepositing;

projection-exposing, developing and curing the photoresist layer to form a structured photoresist mask;

structuring the closed metal layer by one of dry etching and wet etching and;
removing the photoresist mask, leaving behind the closed metal layer structure defining the conduction paths, the metal lands on the elevations, and the conductor tracks on the surface.

UNITED STATES PATENT AND TRADEMARK OFFICE
CERTIFICATE OF CORRECTION

PATENT NO.    : 6,897,568 B2
DATED         : May 24, 2005
INVENTOR(S)   : Alfred Haimerl et al.

It is certified that error appears in the above-identified patent and that said Letters Patent is hereby corrected as shown below:

<u>Column 16 (cont'd),</u>

25. The method according to claim 19, which comprises after applying the elevations, forming a roughened surface by roughening a surface of the elevations at least in a region of where the conduction paths are to be formed.

26. The method according to claim 25, which comprises after the roughening of the surface of the elevations and before an application of a conducting material for forming the conduction paths on the sloping sides of the elevations, depositing seeds on a surface of the elevations.

27. The method according to claim 26, which comprises forming the seeds from palladium.

28. The method according to claim 25, which comprises depositing a conducting material on the roughened surface for forming the conduction paths on the sloping sides of the elevations.

29. The method according to claim 19, which comprises:

applying an insulating layer to the surface; and roughening a surface of the insulating layer at least in a region of the conductor tracks to be formed.

30. The method according to claim 29, which after the roughening of the surface of the insulating layer and before an application of a conducting material for forming conductor tracks on the surface of the insulating layer, depositing seeds on the surface of the insulating layer.

31. The method according to claim 30, which comprises forming the seeds from palladium.

32. The method according to claim 19, which comprises:

applying an insulating layer to the surface; and

UNITED STATES PATENT AND TRADEMARK OFFICE
CERTIFICATE OF CORRECTION

| | | |
|---|---|---|
| PATENT NO. | : 6,897,568 B2 | Page 3 of 4 |
| DATED | : May 24, 2005 | |
| INVENTOR(S) | : Alfred Haimerl et al. | |

It is certified that error appears in the above-identified patent and that said Letters Patent is hereby corrected as shown below:

Column 16 (cont'd),

```
using a laser for roughening a surface of the insulating layer at least
in a region of the conductor tracks to be formed.
```

33. The method according to claim 19, which compromises using an adhesive for adhesively bonding at least the chip onto a printed circuit board, with the metal lands on the elevations being processed onto contact terminal areas of the printed circuit board.

34. The method according to claim 33, which comprises using a special adhesive which shrinks as it cures as the adhesive.

35. The method according to claim 33, which comprises disposing the adhesive on the printed circuit board in a form of bumps of the adhesive.

36. The method according to claim 34, which comprises applying the adhesive in a form of a surface covering drop on upper side of the printed circuit board and the chip is subsequently pressed with the lands onto the contact terminal areas until a curing and shrinking of the adhesive has ended.

```
37. The method according to claim 19, which comprises after applying the
rubber-elastic elevation, using a laser for roughening a surface of the
elevations at least in a region where the conduction paths are to be
formed.
```

UNITED STATES PATENT AND TRADEMARK OFFICE
CERTIFICATE OF CORRECTION

PATENT NO.   : 6,897,568 B2
DATED        : May 24, 2005
INVENTOR(S)  : Alfred Haimerl et al.

It is certified that error appears in the above-identified patent and that said Letters Patent is hereby corrected as shown below:

Column 16 (cont'd),

38. A method for producing a metal layer structure having elevations and depressions on flat surfaces, which comprises the step of:

forming a metal layer in a selective and structured manner by inkjet printing by use of an organometallic solution as ink and subsequent vaporization of a solvent during heat treatment operation. --.

This certificate supersedes Certificate of Correction issued November 29, 2005.

Signed and Sealed this

Eleventh Day of April, 2006

JON W. DUDAS
*Director of the United States Patent and Trademark Office*

UNITED STATES PATENT AND TRADEMARK OFFICE
CERTIFICATE OF CORRECTION

PATENT NO. : 6,897,568 B2
APPLICATION NO. : 10/260872
DATED : May 24, 2005
INVENTOR(S) : Alfred Haimerl et al.

It is certified that error appears in the above-identified patent and that said Letters Patent is hereby corrected as shown below:

<u>Column 16,</u>
Claims 20-38 should be included as follows:

-- 20. The method according to claim 19, which comprises performing the printing process using screen printing through a perforated stencil.

21. The method according to claim 19, which comprises creating the elevations by a number of successive printing operations through perforated stencils made to match one another.

22. The method according to claim 20, which comprises using a perforated metal foil as the perforated stencil.

23. The method according to claim 19, which comprises producing a metal layer structure for forming the conduction paths, the metals lands on the elevations, and the conductor tracks on the surface, simultaneously.

24. The method according to claim 23, which comprises producing the metal layer structure by the following steps:

applying a closed metal layer to the surface and to the elevations by a method selected from the group consisting of sputtering, electroplating and vapor-depositing;

applying a closed photoresist layer to the closed metal layer by one of spraying on and electrodepositing;

projection-exposing, developing and curing the photoresist layer to form a structured photoresist mask;

structuring the closed metal layer by one of dry etching and wet etching and;
removing the photoresist mask, leaving behind the closed metal layer structure defining the conduction paths, the metal lands on the elevations, and the conductor tracks on the surface.

UNITED STATES PATENT AND TRADEMARK OFFICE
CERTIFICATE OF CORRECTION

PATENT NO. : 6,897,568 B2
APPLICATION NO. : 10/260872
DATED : May 24, 2005
INVENTOR(S) : Alfred Haimerl et al.

It is certified that error appears in the above-identified patent and that said Letters Patent is hereby corrected as shown below:

Column 16 (cont'd),

25. The method according to claim 19, which comprises after applying the elevations, forming a roughened surface by roughening a surface of the elevations at least in a region of where the conduction paths are to be formed.

26. The method according to claim 25, which comprises after the roughening of the surface of the elevations and before an application of a conducting material for forming the conduction paths on the sloping sides of the elevations, depositing seeds on a surface of the elevations.

27. The method according to claim 26, which comprises forming the seeds from palladium.

28. The method according to claim 25, which comprises depositing a conducting material on the roughened surface for forming the conduction paths on the sloping sides of the elevations.

29. The method according to claim 19, which comprises:

applying an insulating layer to the surface; and roughening a surface of the insulating layer at least in a region of the conductor tracks to be formed.

30. The method according to claim 29, which after the roughening of the surface of the insulating layer and before an application of a conducting material for forming conductor tracks on the surface of the insulating layer, depositing seeds on the surface of the insulating layer.

31. The method according to claim 30, which comprises forming the seeds from palladium.

32. The method according to claim 19, which comprises:

applying an insulating layer to the surface; and

UNITED STATES PATENT AND TRADEMARK OFFICE
CERTIFICATE OF CORRECTION

PATENT NO. : 6,897,568 B2
APPLICATION NO. : 10/260872
DATED : May 24, 2005
INVENTOR(S) : Alfred Haimerl et al.

It is certified that error appears in the above-identified patent and that said Letters Patent is hereby corrected as shown below:

Column 16 (cont'd), using a laser for roughening a surface of the insulating layer at least in a region of the conductor tracks to be formed.

33. The method according to claim 19, which comprises using an adhesive for adhesively bonding at least the chip onto a printed circuit board, with the metal lands on the elevations being processed onto contact terminal areas of the printed circuit board.

34. The method according to claim 33, which comprises using a special adhesive which shrinks as it cures as the adhesive.

35. The method according to claim 33, which comprises disposing the adhesive on the printed circuit board in a form of bumps of the adhesive.

36. The method according to claim 34, which comprises applying the adhesive in a form of a surface covering drop on upper side of the printed circuit board and the chip is subsequently pressed with the lands onto the contact terminal areas until a curing and shrinking of the adhesive has ended.

37. The method according to claim 19, which comprises after applying the rubber-elastic elevation, using a laser for roughening a surface of the elevations at least in a region where the conduction paths are to be formed.

UNITED STATES PATENT AND TRADEMARK OFFICE
CERTIFICATE OF CORRECTION

PATENT NO. : 6,897,568 B2
APPLICATION NO. : 10/260872
DATED : May 24, 2005
INVENTOR(S) : Alfred Haimerl et al.

It is certified that error appears in the above-identified patent and that said Letters Patent is hereby corrected as shown below:

Column 16 (cont'd),

38. A method for producing a metal layer structure having elevations and depressions on flat surfaces, which comprises the step of:

forming a metal layer in a selective and structured manner by inkjet printing by use of an organometallic solution as ink and subsequent vaporization of a solvent during heat treatment operation. --.

This certificate supersedes Certificates of Correction issued November 29, 2005 and April 11, 2006.

Signed and Sealed this

Seventeenth Day of October, 2006

JON W. DUDAS
*Director of the United States Patent and Trademark Office*